(12) United States Patent
Nakabayashi et al.

(10) Patent No.: US 11,211,288 B2
(45) Date of Patent: Dec. 28, 2021

(54) SEMICONDUCTOR DEVICE

(71) Applicant: TOKYO ELECTRON LIMITED, Tokyo (JP)

(72) Inventors: Hajime Nakabayashi, Tokyo (JP); Koji Akiyama, Nirasaki (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 16/123,214

(22) Filed: Sep. 6, 2018

(65) Prior Publication Data

US 2019/0074216 A1    Mar. 7, 2019

(30) Foreign Application Priority Data

Sep. 7, 2017 (JP) .............................. JP2017-172353

(51) Int. Cl.
| | | |
|---|---|---|
| *H01L 21/768* | (2006.01) | |
| *H01L 23/64* | (2006.01) | |
| *H01L 23/532* | (2006.01) | |
| *H01L 23/522* | (2006.01) | |

(52) U.S. Cl.
CPC .... *H01L 21/76829* (2013.01); *H01L 23/5222* (2013.01); *H01L 23/53295* (2013.01); *H01L 23/64* (2013.01); *H01L 23/5227* (2013.01)

(58) Field of Classification Search
CPC ........... H01L 21/76829; H01L 23/5222; H01L 23/64; H01L 23/53295; H01L 23/5227; H01L 23/53266; H01L 23/53238; H01L 21/76831; H01L 21/76834; H01L 21/76846; H01L 21/2855
See application file for complete search history.

(56) References Cited

U.S. PATENT DOCUMENTS

| | | | |
|---|---|---|---|
| 6,452,276 B1 * | 9/2002 | Cohen | H01L 21/76843 257/763 |
| 9,412,654 B1 * | 8/2016 | Bao | H01L 21/76876 |
| 9,620,611 B1 * | 4/2017 | Clifton | H01L 29/4966 |
| 2012/0181070 A1 * | 7/2012 | Kanki | H01L 21/02071 174/257 |
| 2015/0214293 A1 * | 7/2015 | Liao | H01L 23/53238 257/532 |
| 2015/0221597 A1 * | 8/2015 | Omori | H01L 23/53228 257/751 |

FOREIGN PATENT DOCUMENTS

| | | |
|---|---|---|
| JP | 2008-277437 A | 11/2008 |
| JP | 2010-147311 A | 7/2010 |
| JP | 2012169590 A | 9/2012 |
| JP | 2016111347 A | 6/2016 |
| KR | 2003-0040050 A | 5/2003 |

* cited by examiner

*Primary Examiner* — Su C Kim
(74) *Attorney, Agent, or Firm* — Nath, Goldberg & Meyer; Jerald L. Meyer; Tanya E. Harkins (57) ABSTRACT

There is provided a semiconductor device including: a first wiring; a second wiring; a dielectric layer configured to insulate the first wiring and the second wiring from each other; and an impedance adjustment layer formed between the first wiring and the second wiring, and configured to adjust an impedance between the first wiring and the second wiring.

7 Claims, 3 Drawing Sheets

SEMICONDUCTOR DEVICE

CROSS-REFERENCE TO RELATED APPLICATION

This application claims the benefit of Japanese Patent Application No. 2017-172353, filed on Sep. 7, 2017, in the Japan Patent Office, the disclosure of which is incorporated herein in its entirety by reference.

TECHNICAL FIELD

The present disclosure relates to a semiconductor device.

BACKGROUND

Various technological developments have been made in semiconductor devices to meet demands for an increase in process speed of semiconductor devices, a decrease in size and higher integration of wiring patterns. In the related art, a technique, which includes forming a barrier film on a surface of a trench; forming a ruthenium (Ru) film on the barrier film; forming a copper (Cu) film on the Ru film so that Cu migrates by physical vapor deposition (PVD) while heating the Cu film; and burying the trench, has been applied in an interlayer dielectric film having the trench formed in a wafer. In addition, a method of forming a Cu wiring to suppress an increase in via resistance is used in a process of forming a Cu wiring which is in contact with a wiring made of tungsten. This method includes forming a Cu wiring by burying Cu into a recess (trench) formed in a substrate which is in contact with and arranged in a tungsten-made wiring. The method includes removing a tungsten oxide formed on a surface of the tungsten-made wiring, forming an anti-nitridation film on at least the surface of the tungsten wiring inside the recess forming a barrier film for preventing Cu from diffusing from above the anti-nitridation film toward an inner surface of the recess, forming a liner film on the barrier film, and burying a Cu film on the liner film.

Along with the miniaturization of the semiconductor device, a pitch between the wirings of the semiconductor device is also reduced. The reduction of the pitch between the wirings in the semiconductor device increases parasitic capacitance between the wirings. This increases the delay (RC delay) of signals propagating through the wirings of the semiconductor device. Therefore, there is a demand for a technique of reducing the delay of the signals propagating through the wirings of the semiconductor device.

SUMMARY

According to one embodiment of the present disclosure, there is provided a semiconductor device including: a first wiring; a second wiring; a dielectric layer configured to insulate the first wiring and the second wiring from each other; and an impedance adjustment layer formed between the first wiring and the second wiring, and configured to adjust an impedance between the first wiring and the second wiring.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments. In the figures, the same or equivalent parts will be designated by like reference numerals.

First Embodiment

Figure 1:
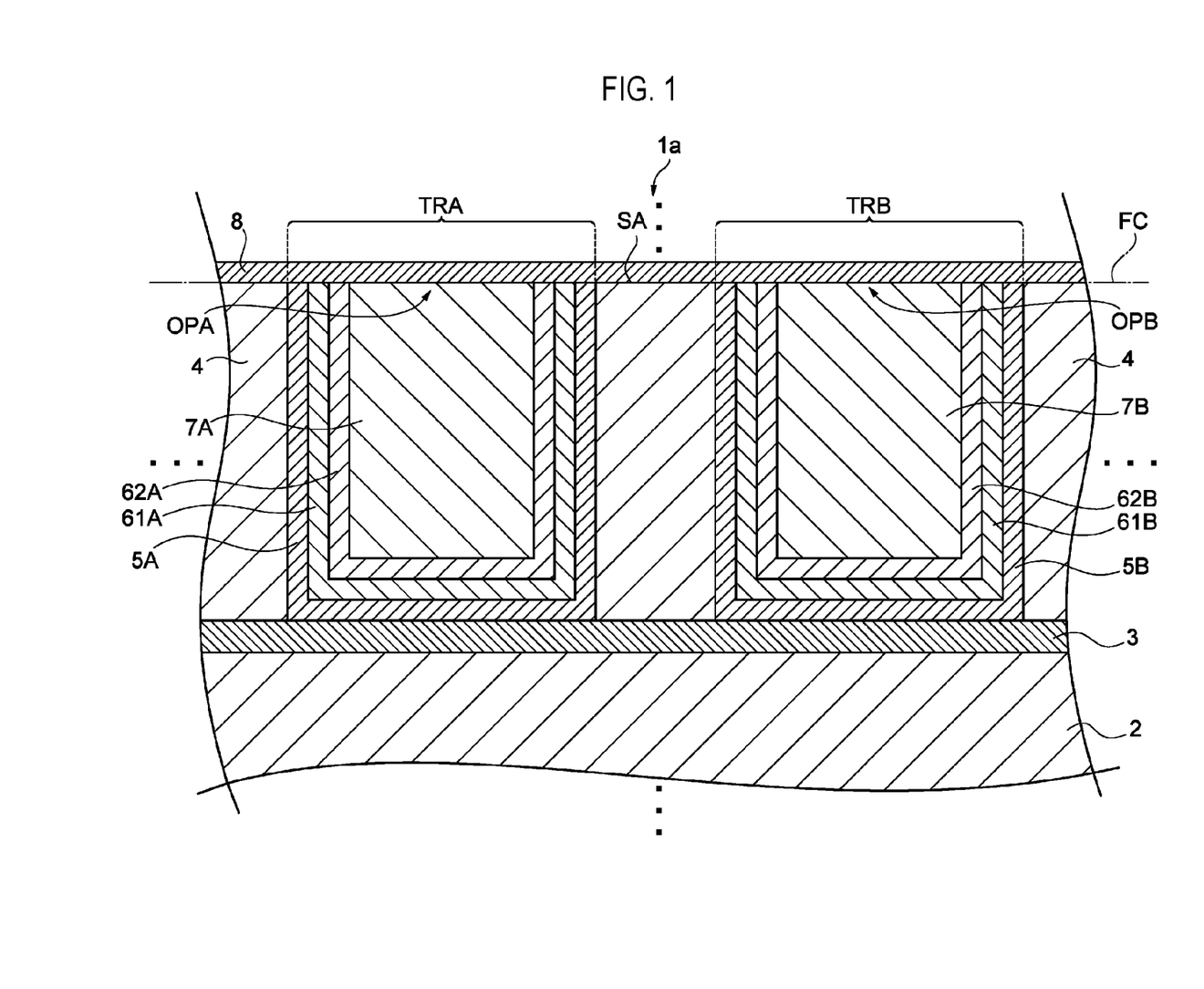
FIG. 1 is a cross-sectional view showing an example of main components of a semiconductor device according to a first embodiment of the present disclosure.

FIG. 1 is a cross-sectional view showing an example of main components of a semiconductor device according to a first embodiment of the present disclosure. A semiconductor device 1a according to the first embodiment shown in FIG. 1 includes a trench TRA, a trench TRB, an interlayer dielectric film 2 (dielectric layer), an etching stop layer 3, an interlayer dielectric film 4 (dielectric layer), an impedance adjustment layer 5A, an impedance adjustment layer 5B, a barrier layer 61A, a barrier layer 61B, a seed layer 62A, a seed layer 62B, a wiring 7A (first wiring), a wiring 7B (second wiring), and a cap layer 8. Although FIG. 1 shows two wirings, namely the wiring 7A and the wiring 7B, the semiconductor device 1a may include three or more wirings. In one embodiment, the wiring 7A and the wiring 7B are arranged along a surface of the semiconductor device 1a (a surface extending along a reference plane FC to be described later). The semiconductor device 1a has a multilayer interconnection structure. More specifically, the semiconductor device 1a includes a plurality of components shown in FIG. 1. In the semiconductor device 1a, the plurality of components is stacked one above another.

The main components of the semiconductor device 1a will be described. The semiconductor device 1a includes the interlayer dielectric film 2. The etching stop layer 3 is formed on the interlayer dielectric film 2. The trench TRA, the trench TRB, and the interlayer dielectric film 4 are formed on the etching stop layer 3. The cap layer 8 is formed on the trench TRA, the trench TRB, and the interlayer dielectric film 4. The trench TRA and the trench TRB are disposed in parallel to each other between the etching stop layer 3 and the cap layer 8. The interlayer dielectric film 4 is disposed between the trench TRA and the trench TRB.

The impedance adjustment layer 5A, the barrier layer 61A, the seed layer 62A, and the wiring 7A are formed inside the trench TRA. The impedance adjustment layer 5B, the barrier layer 61B, the seed layer 62B, and the wiring 7B are formed inside the trench TRB. In the trench TRA, the impedance adjustment layer 5A is formed on an inner surface of the trench TRA. The impedance adjustment layer 5A, which is formed on a bottom surface of the inner surface of the trench TRA, is formed on the etching stop layer 3. The barrier layer 61A is formed on the impedance adjustment layer 5A. The seed layer 62A is formed on the barrier layer 61A. The wiring 7A is formed on the seed layer 62A. The cap layer 8 is formed on the wiring 7A. In the trench TRB, the impedance adjustment layer 5B is formed on an inner surface of the trench TRB. The impedance adjustment layer 5B, which is formed on a bottom surface of the inner surface of the trench TRB, is formed on the etching stop layer 3. The barrier layer 61B is formed on the impedance adjustment layer 5B. The seed layer 62B is formed on the barrier layer 61B. The wiring 7B is formed on the seed layer 62B. The cap layer 8 is formed on the wiring 7B. The impedance adjustment layer 5A and the impedance adjustment layer 5B are formed between the wiring 7A and the wiring 7B. The impedance adjustment layer 5A, the barrier layer 61A, and the seed layer 62A are formed between the wiring 7A and the interlayer dielectric film 4. The impedance adjustment layer 5B, the barrier layer 61B, and the seed layer 62B are formed between the wiring 7B and the interlayer dielectric film 4.

The etching stop layer 3 is in contact with the interlayer dielectric film 2 and also in contact with the trench TRA, the trench TRB, and the interlayer dielectric film 4. The trench TRA and the trench TRB are formed in the interlayer dielectric film 4 to extend in a direction crossing the cross section shown in FIG. 1. The trench TRA and the trench TRB extend from the reference plane FC to the etching stop layer 3. The reference plane FC is a virtual plane used for the sake of convenience in description, and includes a surface SA of the interlayer dielectric film 4, an opening OPA of the trench TRA, and an opening OPB of the trench TRB. The bottom surface of the trench TRA and the bottom surface of the trench TRB are included in the surface of the etching stop layer 3. Side surfaces of the trench TRA and the trench TRB are included in the surface of the interlayer dielectric film 4.

The impedance adjustment layer 5A is formed on the inner surface of the trench TRA (the bottom surface and the side surface of the trench TRA). The impedance adjustment layer 5A extends along the side surface of the trench TRA from the reference plane FC inside the trench TRA. The impedance adjustment layer 5A covers the inner surface of the trench TRA. The impedance adjustment layer 5A is in contact with the etching stop layer 3, the interlayer dielectric film 4, and the barrier layer 61A. The impedance adjustment layer 5A is in contact with the etching stop layer 3 in the bottom surface of the trench TRA. The impedance adjustment layer 5A is in contact with the interlayer dielectric film 4 in the side surface of the trench TRA.

The impedance adjustment layer 5B is formed on the inner surface of the trench TRB (the bottom surface and the side surface of the trench TRB). The impedance adjustment layer 5B extends along the side surface of the trench TRB from the reference plane FC inside the trench TRB. The impedance adjustment layer 5B covers the inner surface of the trench TRB. The impedance adjustment layer 5B is in contact with the etching stop layer 3, the interlayer dielectric film 4, and the barrier layer 61B. The impedance adjustment layer 5B is in contact with the etching stop layer 3 in the bottom surface of the trench TRB. The impedance adjustment layer 5B is in contact with the interlayer dielectric film 4 in the side surface of the trench TRB.

For example, a film thickness of the impedance adjustment layer 5A and a film thickness of the impedance adjustment layer 5B are substantially the same. For example, the film thickness of the impedance adjustment layer 5A and the film thickness of the impedance adjustment layer 5B are substantially equal to each other. In the present specification, the term "substantially" means that the range of fluctuations that may occur at the time of implementation is taken into consideration.

The barrier layer 61A is formed between the impedance adjustment layer 5A and the wiring 7A. The barrier layer 61A extends along the side surface of the trench TRA from the reference plane FC inside the trench TRA. The barrier layer 61A covers the surface of the impedance adjustment layer 5A inside the trench TRA. The barrier layer 61A is in contact with the impedance adjustment layer 5A. A film thickness of the barrier layer 61A is substantially uniform throughout the barrier layer 61A. In one embodiment, the barrier layer 61A is conformally formed on the surface of the impedance adjustment layer 5A.

The barrier layer 61B is formed between the impedance adjustment layer 5B and the wiring 7B. The barrier layer 61B extends along the side surface of the trench TRB from the reference plane FC inside the trench TRB. The barrier layer 61B covers the surface of the impedance adjustment layer 5B inside the trench TRB. The barrier layer 61B is in contact with the impedance adjustment layer 5B. A film thickness of the barrier layer 61B is substantially uniform throughout the barrier layer 61B. In one embodiment, the barrier layer 61B is conformally formed on the surface of the impedance adjustment layer 5B.

The seed layer 62A is formed on the barrier layer 61A. The seed layer 62A extends along the side surface of the trench TRA from the reference plane FC inside the trench TRA. The seed layer 62A covers the surface of the barrier layer 61A inside the trench TRA. The seed layer 62A is in contact with the barrier layer 61A. A film thickness of the seed layer 62A is substantially uniform throughout the seed layer 62A.

The seed layer 62B is formed on the barrier layer 61B. The seed layer 62B extends along the side surface of the trench TRB from the reference surface FC inside the trench TRB. The seed layer 62B covers the surface of the barrier layer 61B inside the trench TRB. The seed layer 62B is in contact with the barrier layer 61B. A film thickness of the seed layer 62B is substantially uniform throughout the seed layer 62B.

The wiring 7A is filled in a spatial region defined by the reference surface FC and the seed layer 62A inside the trench TRA. The wiring 7A is in contact with the seed layer 62A and the cap layer 8. The wiring 7B is filled in a spatial region defined by the reference surface FC and the seed layer 62B inside the trench TRB. The wiring 7B is in contact with the seed layer 62B and the cap layer 8.

The cap layer 8 is in contact with the wiring 7A, the wiring 7B, the seed layer 62A, the seed layer 62B, the barrier layer 61A, the barrier layer 61B, the impedance adjustment layer 5A, the impedance adjustment layer 5B, and the interlayer dielectric film 4 on the reference surface FC. The cap layer 8 covers the opening OPA of the trench TRA and the opening OPB of the trench TRB. A film thickness of the cap layer 8 is substantially uniform throughout the cap layer 8.

The interlayer dielectric film 2 and the interlayer dielectric film 4 have a function of insulating the wirings 7A and 7B from each other. The impedance adjustment layer 5A and the impedance adjustment layer 5B have a function of adjusting impedance between the wiring 7A and the wiring 7B. The impedance adjustment layer 5A and the impedance adjustment layer 5B suppress the influence of parasitic capacitance of the semiconductor device 1a and reduce the delay (RC delay) of a signal propagating through the wiring 7A and a signal propagating through the wiring 7B. The barrier layer 61A has a function of preventing diffusion of the material of the wiring 7A. The barrier layer 61B has a function of preventing diffusion of the material of the wiring 7B. The seed layer 62A functions as an electrode at the time of forming the wiring 7A (at the time of forming the wiring 7A by plating). The seed layer 62B functions as an electrode at the time of forming the wiring 7B (at the time of forming the wiring 7B by plating).

A material of the interlayer dielectric film 2 is, for example, $SiO_2$ and SiOCH. A material of the etching stop layer 3 is, for example, SiN. A material of the interlayer dielectric film 4 includes, for example, $SiO_2$ and SiOCH. Materials of the impedance adjustment layer 5A and the impedance adjustment layer 5B include a Mott-insulator. The materials of the impedance adjustment layer 5A and the impedance adjustment layer 5B include, for example, $VO_2$ (vanadium dioxide) as the Mott-insulator. Materials of the barrier layer 61A and the barrier layer 61B include, for example, TiN, Ti, TaN, Ta, WN, and W. Materials of the seed layer 62A and the seed layer 62B include, for example, Cu and W. Materials of the wiring 7A and the wiring 7B include, for example, Cu and W. A material of the cap layer 8 includes, for example, SiN.

In the semiconductor device 1a configured as above, the impedance adjustment layer 5A and the impedance adjustment layer 5B for adjusting the impedance between the wiring 7A and the wiring 7B are formed between the wiring 7A and the wiring 7B. Thus, the delay (RC delay) of the signals propagating through the wirings 7A and 7B is reduced by the presence of the impedance adjustment layer 5A and the impedance adjustment layer 5B.

Both the impedance adjustment layer 5A and the impedance adjustment layer 5B include the Mott-insulator. Since electrons in the Mott-insulator undergo plasma oscillation under an AC electric field, both the impedance adjustment layer 5A and the impedance adjustment layer 5B equivalently function as a parallel LC circuit under the AC electric field. Furthermore, the parallel LC circuit functions as an inductor in a frequency region below a resonance frequency. The interlayer dielectric film 4 has parasitic capacitance. Therefore, in the frequency region below the resonance frequency, the function of a series LC circuit is equivalently exerted by the inductor of each of the impedance adjustment layers 5A and 5B and the parasitic capacitance of the interlayer dielectric film 4. Meanwhile, the delay of the signal propagating through the wiring 7A and the delay of the signal propagating through the wiring 7B are an RC delay caused mainly by the parasitic capacitance of the interlayer dielectric film 4. Thus, the delays may be regarded as phase delays of the signals. The inductor of each of the impedance adjustment layers 5A and 5B compensate for the phase delays of the signals. Therefore, the delay of the signal propagating through the wiring 7A and the delay of the signal propagating through the wiring 7B are reduced by the impedance adjustment layer 5A and the impedance adjustment layer 5B, respectively.

In some embodiments, each of the material of the impedance adjustment layer 5A and the material of the impedance adjustment layer 5B may contain $VO_2$ in some cases. In this case, since the electron effective mass at $VO_2$ is relatively heavy, the resonance frequency of the parallel LC circuit of each of the impedance adjustment layer 5A and the impedance adjustment layer 5B is set to have a frequency band from microwave to ultra-short wave. Therefore, it is possible to effectively realize the aforementioned compensation (reduction in the RC delay) of the phase delays of the signals in the respective frequency band in which a rising signal waveform of each of the signal propagating through the wiring 7A and the signal propagating through the wiring 7B is determined.

In order for each of the impedance adjustment layer 5A and the impedance adjustment layer 5B to equivalently function effectively as a parallel LC circuit, the film thickness of each of the impedance adjustment layer 5A and the impedance adjustment layer 5B may be equal to or larger than the Debye length due to plasma in $VO_2$. In a case in which $VO_2$ is doped with metal impurities such as W (tungsten), Al (aluminum) or the like, the density of electrons in $VO_2$ is increased. Thus, the Debye length is sufficiently reduced until reaching about several tens of nm. Therefore, the miniaturization of the wiring structure of the semiconductor device 1a is realized.

Next, an example of a method of manufacturing the semiconductor device 1a according to the first embodiment will be schematically described. In manufacturing the semiconductor device 1a according to the first embodiment, a multi-chamber type film-forming system including a plurality of film-forming apparatuses is used. First, the etching stop layer 3 is formed on the surface of the interlayer dielectric film 2 by a plasma chemical vapor deposition (CVD) method. After the formation of the etching stop layer 3, the interlayer dielectric film 4 is formed on the surface of the etching stop layer 3 by the plasma CVD method. After the formation of the interlayer dielectric film 4, the interlayer dielectric film 4 is etched until reaching the etching stop layer 3, thus forming the trench TRA and the trench TRB.

After the formation of the trench TRA and the trench TRB, sputtering is performed to form the impedance adjustment layer 5A on the inner surface (specifically, the surface of the interlayer dielectric film 4 inside the trench TRA and the surface of the etching stop layer 3 inside the trench TRA) of the trench TRA, and the impedance adjustment layer 5B on the inner surface (specifically, the surface of the interlayer dielectric film 4 inside the trench TRB and the surface of the etching stop layer 3 inside the trench TRB) of the trench TRB. When each of the material of the impedance adjustment layer 5A and the material of the impedance adjustment layer 5B includes $VO_2$, metal vanadium or vanadium oxide is scattered from a surface of a target by sputtering. The metal vanadium or vanadium oxide scattering from the surface of the target reacts with an oxygen gas when reaching the inner surface of the trench TRA and the inner surface of the trench TRB. Thus, vanadium atoms and oxygen atoms are regularly arranged at a ratio of 1:2, so that $VO_2$ can grow. The impedance adjustment layer 5A made of $VO_2$ is formed on the inner surface of the trench TRA and the impedance adjustment layer 5B made of $VO_2$ is formed on the inner surface of the trench TRB.

After the formation of the impedance adjustment layer 5A and the impedance adjustment layer 5B, the barrier layer 61A is formed on the surface of the impedance adjustment layer 5A inside the trench TRA, and the barrier layer 61B is formed on the surface of the impedance adjustment layer 5B inside the trench TRB. Any one of a thermal CVD method, a thermal atomic layer deposition (ALD) method, and a plasma CVD method is used to form the barrier layer 61A and the barrier layer 61B. After the formation of the barrier layer 61A and the barrier layer 61B, sputtering is performed to form the seed layer 62A on the surface of the barrier layer 61A inside the trench TRA and the seed layer 62B on the surface of the barrier layer 61B inside the trench TRB.

After the formation of the seed layer 62A and the seed layer 62B, an electric field plating or electroless plating is performed to form the wiring 7A in a spatial region defined by the seed layer 62A and the reference plane FC inside the trench TRA, and the wiring 7B in a spatial region defined by the seed layer 62B and the reference plane FC inside the trench TRB. In the step of forming the wiring 7A and the wiring 7B, the material of the wiring 7A is filled in the trench TRA and the material of the wiring 7B is filled in the trench TRB, and subsequently, excess material is removed by a chemical mechanical polishing (CMP) method. Thus, each of the surface of the wiring 7A and the surface of the wiring 7B is flattened along the reference plane FC. After the formation of the wiring 7A and the wiring 7B, the cap layer 8 is formed on the wiring 7A and the wiring 7B (with respect to the reference plane FC) by the plasma CVD method. In this manner, the main components of the semiconductor device 1a shown in FIG. 1 are manufactured.

Second Embodiment

Figure 2:
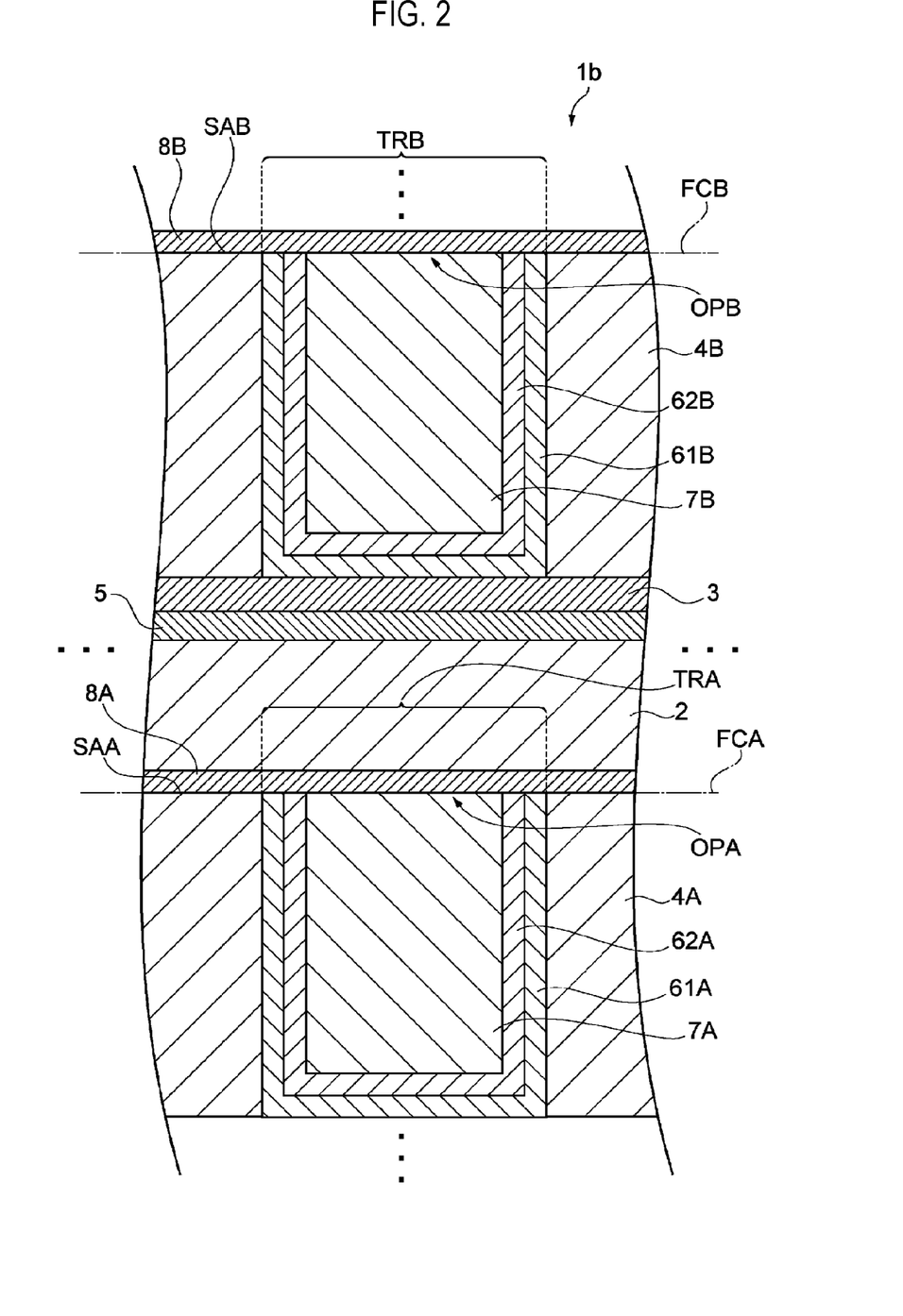
FIG. 2 is a cross-sectional view showing an example of main components of a semiconductor device according to a second embodiment of the present disclosure.

FIG. 2 is a cross-sectional view showing an example of main components of a semiconductor device according to a second embodiment of the present disclosure. A semiconductor device 1b according to the second embodiment shown in FIG. 2 has a multilayer interconnection structure. More specifically, the semiconductor device 1b includes a plurality of components shown in FIG. 2. In the semiconductor device 1b, the plurality of components is stacked one above another.

As shown in FIG. 2, the semiconductor device 1b includes a trench TRA, a trench TRB, an interlayer dielectric film 2, an etching stop layer 3, an interlayer dielectric film 4A, an interlayer dielectric film 4B, an impedance adjustment layer 5, a barrier layer 61A, a barrier layer 61B, a seed layer 62A, a seed layer 62B, a wiring 7A, a wiring 7B, a cap layer 8A, and a cap layer 8B.

The trench TRA is formed in the interlayer dielectric film 4A. The cap layer 8A is formed on the trench TRA and the interlayer dielectric film 4A. The cap layer 8A is formed on a reference plane FCA. The reference plane FCA is a virtual plane used for the sake of convenience in description and includes a surface SAA of the interlayer dielectric film 4A and an opening OPA of the trench TRA.

The interlayer dielectric film 2 is formed on the cap layer 8A. The impedance adjustment layer 5 is formed on the interlayer dielectric film 2. The etching stop layer 3 is formed on the impedance adjustment layer 5. The trench TRB and the interlayer dielectric film 4B are formed on the etching stop layer 3. The cap layer 8B is formed on the trench TRB and the interlayer dielectric film 4B. The trench TRB is disposed between the etching stop layer 3 and the cap layer 8B. The interlayer dielectric film 2 is formed between the trench TRA and the trench TRB.

The barrier layer 61A, the seed layer 62A, and the wiring 7A are formed inside the trench TRA. The barrier layer 61B, the seed layer 62B, and the wiring 7B are formed inside the trench TRB. In the trench TRA, the barrier layer 61A is formed on an inner surface of the trench TRA, the seed layer 62A is formed on the barrier layer 61A, the wiring 7A is formed on the seed layer 62A, and the cap layer 8A is formed on the wiring 7A. In the trench TRB, the barrier layer 61B is formed on an inner surface of the trench TRB, the barrier layer 61B is formed on the etching stop layer 3, the seed layer 62B is formed on the barrier layer 61B, and the wiring 7B is formed on the seed layer 62B. The cap layer 8B is formed on the wiring 7B. The impedance adjustment layer 5 is formed between the wiring 7A and the wiring 7B. The barrier layer 61A and the seed layer 62A are formed between the wiring 7A and the interlayer dielectric film 4A. The barrier layer 61B and the seed layer 62B are formed between the wiring 7B and the interlayer dielectric film 4B.

The trench TRA is formed in the interlayer dielectric film 4A to extend in a direction crossing the cross section shown in FIG. 2. A side surface of the trench TRA is included in a surface of the interlayer dielectric film 4A. The cap layer 8A is in contact with the trench TRA, the interlayer dielectric film 4A, and the interlayer dielectric film 2. The interlayer dielectric film 2 is in contact with the cap layer 8A and the impedance adjustment layer 5. The impedance adjustment layer 5 is in contact with the etching stop layer 3. The etching stop layer 3 is in contact with the trench TRB and the interlayer dielectric film 4B. The trench TRB is formed in the interlayer dielectric film 4B to extend in a direction crossing the cross section shown in FIG. 2. The trench TRB extends from the reference plane FCB to the etching stop layer 3. The reference plane FCB is a virtual plane used for the sake of convenience in description and includes a surface SAB of the interlayer dielectric film 4B and an opening OPB of the trench TRB. A bottom surface of the trench TRB is included in the surface of the etching stop layer 3. A side surface of the trench TRB is included in the surface of the interlayer dielectric film 4B.

The impedance adjustment layer 5 is formed between the interlayer dielectric film 2 and the etching stop layer 3. The impedance adjustment layer 5 is formed between the trench TRA and the trench TRB. The impedance adjustment layer 5 is formed between the wiring 7A formed in the trench TRA and the wiring 7B formed in the trench TRB. A film thickness of the impedance adjustment layer 5 is substantially uniform throughout the impedance adjustment layer 5.

The barrier layer 61A is formed between the interlayer dielectric film 4A and the wiring 7A. The barrier layer 61A extends along the side surface of the trench TRA from the reference plane FCA inside the trench TRA. The barrier layer 61A covers the surface of the trench TRA inside the trench TRA. The barrier layer 61A is in contact with the interlayer dielectric film 4A inside the trench TRA. A film thickness of the barrier layer 61A is substantially uniform throughout the barrier layer 61A. In one embodiment, the barrier layer 61A is conformally formed on the surface of the trench TRA.

The barrier layer 61B is formed between the etching stop layer 3, the interlayer dielectric film 4B, and the wiring 7B. The barrier layer 61B extends along the side surface of the trench TRB from the reference plane FCB inside the trench TRB. The barrier layer 61B covers the surface of the trench TRB inside the trench TRB. The barrier layer 61B is in contact with the etching stop layer 3 and the interlayer dielectric film 4B inside the trench TRB. A film thickness of the barrier layer 61B is substantially uniform throughout the barrier layer 61B. In one embodiment, the barrier layer 61B is conformally formed on the surface of the trench TRB.

The seed layer 62A is formed on the barrier layer 61A. The seed layer 62A extends along the side surface of the trench TRA from the reference plane FCA inside the trench TRA. The seed layer 62A covers the surface of the barrier layer 61A inside the trench TRA. The seed layer 62A is in contact with the barrier layer 61A. A film thickness of the seed layer 62A is substantially uniform throughout the seed layer 61B.

The seed layer 62B is formed on the barrier layer 61B. The seed layer 62B extends along the side surface of the trench TRB from the reference plane FCB inside the trench TRB. The seed layer 62B covers the surface of the barrier layer 61B inside the trench TRB. The seed layer 62B is in contact with the barrier layer 61B. A film thickness of the seed layer 62B is substantially uniform throughout the seed layer 62B.

The wiring 7A is filled in a spatial region defined by the reference plane FCA and the seed layer 62A inside the trench TRA. The wiring 7A is in contact with the seed layer 62A and the cap layer 8A. The wiring 7B is filled in a spatial region defined by the reference plane FCB and the seed layer 62B inside the trench TRB. The wiring 7B is in contact with the seed layer 62B and the cap layer 8B.

The cap layer 8A is in contact with the wiring 7A, the seed layer 62A, the barrier layer 61A, and the interlayer dielectric film 4A in the reference plane FCA. The cap layer 8A covers the opening OPA of the trench TRA. A film thickness of the cap layer 8A is substantially uniform throughout the cap layer 8A.

The cap layer 8B is in contact with the wiring 7B, the seed layer 62B, the barrier layer 61B, and the interlayer dielectric film 4B in the reference plane FCB. The cap layer 8B covers the opening OPB of the trench TRB. A film thickness of the cap layer 8B is substantially uniform throughout the cap layer 8B.

The interlayer dielectric film 2, the interlayer dielectric film 4A, and the interlayer dielectric film 4B have a function of insulating the wiring 7A and the wiring 7B from each other. The impedance adjustment layer 5 has a function of adjusting the impedance between the wiring 7A and the wiring 7B. The impedance adjustment layer 5 suppresses the influence of parasitic capacitance of the semiconductor device 1b, and reduces the delay (RC delay) of a signal propagating through the wiring 7A and a signal propagating through the wiring 7B.

Materials of the interlayer dielectric film 4A and the interlayer dielectric film 4B include, for example, $SiO_2$ and SiOCH. A material of the impedance adjustment layer 5 includes a Mott-insulator. The material of the impedance adjustment layer 5 includes, for example, $VO_2$ (vanadium dioxide) as the Mott insulator. For example, the materials of the cap layer 8A and the cap layer 8B include SiN.

As described above, the impedance adjustment layer 5 is formed so as to be in contact with the etching stop layer 3. Although FIG. 2 shows two wirings, namely the wiring 7A and the wiring 7B, the semiconductor device 1b may have three or more wirings.

An example of a method of manufacturing the semiconductor device 1b according to the second embodiment will be schematically described. In manufacturing the semiconductor device 1b according to the second embodiment, a multi-chamber type film-forming system including a plurality of film-forming apparatuses is used as in the first embodiment. First, the interlayer dielectric film 4A is formed by a plasma CVD method. Subsequently, the interlayer dielectric film 4A is etched to form the trench TRA. After the formation of the trench TRA, the barrier layer 61A is formed on the inner surface (specifically, the surface of the interlayer dielectric film 4A inside the trench TRA) of the trench TRA. Any one of a thermal CVD method, a thermal ALD method, and a plasma CVD method is used in forming the barrier layer 61A. After the formation of the barrier layer 61A, sputtering is performed to form the seed layer 62A is formed on the surface of the barrier layer 61A inside the trench TRA. After the formation of the seed layer 62A, an electric field plating or electroless plating is performed to form the wiring 7A in a spatial region defined by the seed layer 62A and the reference plane FCA inside the trench TRA. In the step of forming the wiring 7A, a material of the wiring 7A is filled in the trench TRA, and then excess material is removed by a CMP method. Thus, the surface of the wiring 7A is flattened along the reference plane FCA.

After the formation of the wiring 7A, the cap layer 8A is formed on the wiring 7A (with respect to the reference plane FCA) by the plasma CVD method. After the formation of the cap layer 8A, the interlayer dielectric film 2 is formed on the cap layer 8A by the plasma CVD method, and subsequently, the impedance adjustment layer 5 is formed on the surface of the interlayer dielectric film 2 by sputtering. In a case in which the material of the impedance adjustment layer 5 includes $VO_2$, metal vanadium or vanadium oxide is scattered from a surface of a target by sputtering. The metal vanadium or vanadium oxide scattering from the surface of the target reacts with an oxygen gas when reaching the surface of the interlayer dielectric film 2. Thus, vanadium atoms and oxygen atoms are regularly arranged at a ratio of 1:2, so that $VO_2$ can grow. Subsequently, the impedance adjustment layer 5 made of $VO_2$ is formed on the surface of the interlayer dielectric film 2.

After the formation of the impedance adjustment layer 5, the etching stop layer 3 is formed on the surface of the impedance adjustment layer 5 by the plasma CVD method. After the formation of the etching stop layer 3, the interlayer dielectric film 4B is formed on the surface of the etching stop layer 3 by the plasma CVD method. Subsequently, the interlayer dielectric film 4B is etched until reaching the etching stop layer 3, thereby forming the trench TRB. After the formation of the trench TRB, the barrier layer 61B is formed on an inner surface (specifically, the surface of the interlayer dielectric film 4B inside the trench TRB and the surface of the etching stop layer 3 inside the trench TRB) of the trench TRB. Any one of a thermal CVD method, a thermal ALD method, and a plasma CVD method is used in forming the barrier layer 61B. After the formation of the barrier layer 61B, sputtering is performed to form the seed layer 62B on the surface of the barrier layer 61B inside the trench TRB.

After the formation of the seed layer 62B, an electric field plating or electroless plating is performed to form the wiring 7B in a spatial region defined by the seed layer 62B and the reference plane FCB inside the trench TRB. In the step of forming the wiring 7B, a material of the wiring 7B is filled in the trench TRB, and then the excess material is removed by the CMP method. Thus, the surface of the wiring 7B is flattened along the reference plane FCB. After the formation of the wiring 7B, the cap layer 8B is formed on the wiring 7B (with respect to the reference plane FCB) by the plasma CVD method. In this manner, the main components of the semiconductor device 1b shown in FIG. 2 are manufactured.

Third Embodiment

Figure 3:
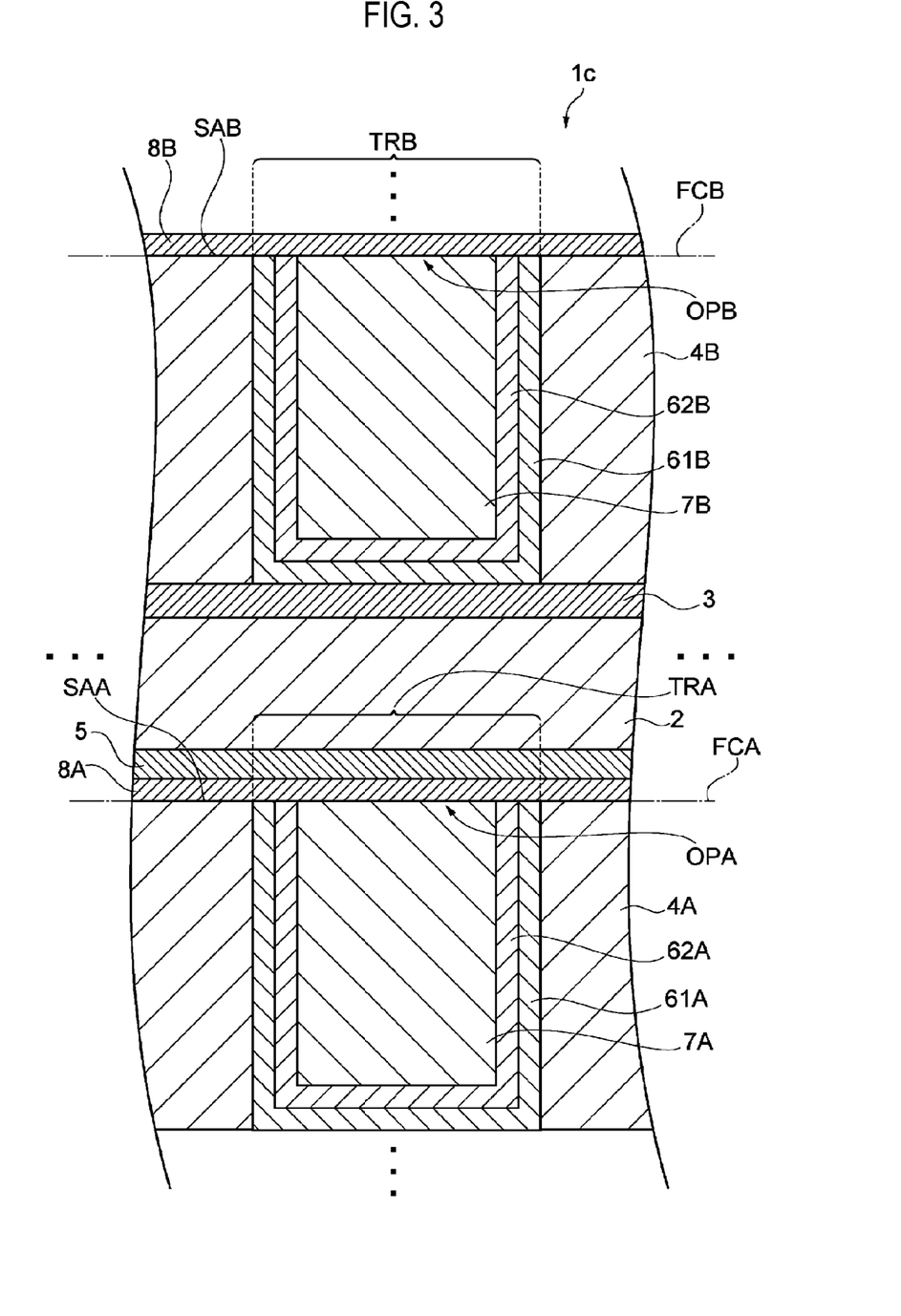
FIG. 3 is a cross-sectional view showing an example of main components of a semiconductor device according to a third embodiment of the present disclosure.

FIG. 3 is a cross-sectional view showing an example of main components of a semiconductor device according to a third embodiment of the present disclosure. The components of a semiconductor device 1c according to the third embodiment shown in FIG. 3 are similar to those of the semiconductor device 1b according to the second embodiment shown in FIG. 2 except for a position where the impedance adjustment layer 5 is formed. The semiconductor device 1c according to the third embodiment shown in FIG. 3 has a multilayer interconnection structure. More specifically, the semiconductor device 1c includes a plurality of components shown in FIG. 3. The plurality of components of the semiconductor device 1c is stacked one above another.

As shown in FIG. 3, the impedance adjustment layer 5 of the semiconductor device 1c is formed between the cap layer 8A and the interlayer dielectric film 2. The impedance adjustment layer 5 is formed between the trench TRA and the trench TRB. The impedance adjustment layer 5 is disposed between the wiring 7A formed in the trench TRA and the wiring 7B formed in the trench TRB. The interlayer dielectric film 2 is in contact with the impedance adjustment layer 5. The interlayer dielectric film 2 is in contact with the etching stop layer 3. A film thickness of the impedance adjustment layer 5 is substantially uniform throughout the impedance adjustment layer 5.

As described above, the impedance adjustment layer 5 is formed so as to be in contact with the cap layer 8A. Although FIG. 3 shows two wirings, namely the wiring 7A and the wiring 7B, the semiconductor device 1c may include three or more wirings.

An example of a method of manufacturing the semiconductor device 1c according to the third embodiment will be schematically described. In manufacturing the semiconductor device 1c according to the third embodiment, a multichamber type film-forming system including a plurality of film-forming apparatuses is used as in the first embodiment. First, the interlayer dielectric film 4A is formed by a plasma CVD method. Thereafter, the interlayer dielectric film 4A is etched to form the trench TRA. After the formation of the trench TRA, the barrier layer 61A is formed on an inner surface (specifically, the surface of the interlayer dielectric film 4A and the like inside the trench TRA) of the trench TRA. Any one of a thermal CVD method, a thermal ALD method, and a plasma CVD method is used in forming the barrier layer 61A. After the formation of the barrier layer 61A, sputtering is performed to form the seed layer 62A on the surface of the barrier layer 61A inside the trench TRA. After the formation of the seed layer 62A, an electric field plating or electroless plating is performed to form the wiring 7A in a spatial region defined by the seed layer 62A and the reference plane FCA inside the trench TRA. In the step of forming the wiring 7A, a material of the wiring 7A is filled in the trench TRA, and then the excess material is removed by a CMP method. Thus, the surface of the wiring 7A is flattened along the reference plane FCA.

After the formation of the wiring 7A, the cap layer 8A is formed on the wiring 7A (with respect to the reference plane FCA) by the plasma CVD method. After the formation of the cap layer 8A, the impedance adjustment layer 5 is formed on the surface of the cap layer 8A by sputtering. In a case in which a material of the impedance adjustment layer 5 includes $VO_2$, metal vanadium or vanadium oxide is scattered from a surface of a target by sputtering. The metal vanadium or vanadium oxide scattering from the surface of the target reacts with an oxygen gas when reaching the surface of the cap layer 8A. Thus, vanadium atoms and oxygen atoms are regularly arranged at a ratio of 1:2, so that $VO_2$ grows. Subsequently, the impedance adjustment layer 5 made of $VO_2$ is formed on the surface of the cap layer 8A. After the formation of the impedance adjustment layer 5, the interlayer dielectric film 2 is formed on the surface of the impedance adjustment layer 5 by the plasma CVD method.

After the formation of the interlayer dielectric layer 2, the etching stop layer 3 is formed on the surface of the interlayer dielectric film 2 by the plasma CVD method. After the formation of the etching stop layer 3, the interlayer dielectric film 4B is formed on the surface of the etching stop layer 3 by the plasma CVD method. Thereafter, the interlayer dielectric film 4B is etched until reaching the etching stop layer 3, thereby forming the trench TRB. After the formation of the trench TRB, the barrier layer 61B is formed on the inner surface (specifically, the surface of the interlayer dielectric film 4B inside the trench TRB and the surface of the etching stop layer 3 inside the trench TRB) of the trench TRB. Any one of a thermal CVD method, a thermal ALD method, and a plasma CVD method is used in forming the barrier layer 61B. After the formation of the barrier layer 61B, the seed layer 62B is formed on the surface of the barrier layer 61B inside the trench TRB by sputtering.

After the formation of the seed layer 62B, an electric field plating or electroless plating is performed to form the wiring 7B in a spatial region defined by the seed layer 62B and the reference plane FCB inside the trench TRB. In the step of forming the wiring 7B, a material of the wiring 7B is filled in the trench TRB, and then the excess material is removed by the CMP method. Thus, the surface of the wiring 7B is flattened along the reference plane FCB. After the formation of the wiring 7B, the cap layer 8B is formed on the wiring 7B (with respect to the reference plane FCB) by the plasma CVD method. In this manner, the main components of the semiconductor device 1c shown in FIG. 3 are manufactured.

In addition, the semiconductor device 1a according to the first embodiment, the semiconductor device 1b according to the second embodiment, and the semiconductor device 1c according to the third embodiment may have a multilayer interconnection structure (as an example, a structure in which a plurality of layers in which wirings are formed and a plurality of via layers are alternately stacked) including a plurality of layers in which wirings (wiring 7A and wiring 7B) made of Cu or W material are formed and a plurality of via layers. In such a multilayer interconnection structure, the arrangement and direction (vertical direction or horizontal direction) of the wirings made of Cu or W is optional.

As described above, according to the present disclosure in some embodiments, it is possible to provide a technique for reducing the delay of a signal propagating through a wiring of a semiconductor device.

While the principle of the present disclosure have been illustrated and described in the above embodiments, it will be appreciated by those skilled in the art that the present disclosure may be modified in arrangement and details without departing from such a principle. The present disclosure is not limited to the specific configurations described in the above embodiments. Accordingly, all modifications and changes coming within the scope of the claims and the spirit thereof are claimed. As an example, the impedance adjustment layer 5 according to each of the second and third embodiments may be formed in the semiconductor device 1a according to the first embodiment. In some embodiments, a semiconductor device may be manufactured by combining any two or all of the configuration of the semiconductor device 1a shown in FIG. 1, the configuration of the semiconductor device 1b shown in FIG. 2, and the configuration of the semiconductor device 1c shown in FIG. 3, and stacking them on top of each other. In some embodiments, the position where the impedance adjustment layer (the impedance adjustment layer 5, 5A, or 5B) is formed is not limited to the positions shown in the first embodiment, the second embodiment, and the third embodiment. The impedance adjustment layer may be formed in other positions of the semiconductor device (positions spaced apart from (positions not in contact with) the etching stop layer 3, the barrier layer 61A, the barrier layer 61B, the cap layer 8, the cap layer 8A, and the cap layer 8B) as long as it is formed between the wiring 7A and the wiring 7B. Even in such a case, the same effect as that of the first embodiment and the like may be obtained.

What is claimed is:

1. A semiconductor device comprising:
    first and second trenches formed in a single dielectric layer, disposed in parallel to each other, and opened in one reference plane;
    an etching stop layer on which the first trench, the second trench, and the single dielectric layer are formed such that the etching stop layer covers entire bottom surfaces of the first trench, the second trench, and the single dielectric layer;
    a first wiring formed in the first trench;
    a second wiring formed in the second trench;
    a first impedance adjustment layer formed in an inner surface of the first trench; and
    a second impedance adjustment layer formed in an inner surface of the second trench,
    wherein a portion of the single dielectric layer is interposed between a side surface of the first trench and a side surface of the second trench, and is configured to insulate the first wiring and the second wiring from each other,
    wherein the first and second impedance adjustment layers formed between the first wiring and the second wiring are configured to adjust an impedance between the first wiring and the second wiring, and each of the first and second impedance adjustment layers serves as an inductor, and
    wherein a material of the first and second impedance adjustment layers includes a Mott-insulator.

2. The semiconductor device of claim 1, wherein the material of the first and second impedance adjustment layers includes vanadium dioxide.

3. The semiconductor device of claim 1, further comprising: a first barrier layer formed between the first impedance adjustment layer and the first wiring; and a second barrier layer formed between the second impedance adjustment layer and the second wiring,
    wherein the first and second impedance adjustment layers are in contact with the first and second barrier layers, respectively.

4. A semiconductor device comprising:
    a first trench formed in a first dielectric layer;
    a second trench formed in a second dielectric layer stacked above the first dielectric layer;
    a first wiring formed in the first trench;
    a second wiring formed in the second trench;
    a third dielectric layer interposed between an upper opening of the first trench and a bottom surface of the second trench, and configured to insulate the first wiring and the second wiring from each other;
    an impedance adjustment layer formed between the first wiring and the second wiring, configured to adjust an impedance between the first wiring and the second wiring, and serving as an inductor; and
    a cap layer formed on the first wiring,
    wherein a material of the impedance adjustment layer includes a Mott-insulator,
    the third dielectric layer is formed on the cap layer,
    the second wiring is formed on the third dielectric layer, and
    the impedance adjustment layer is formed between the cap layer and the third dielectric layer, and is in contact with the cap layer.

5. A semiconductor device comprising:
    a first trench formed in a first dielectric layer;
    a second trench formed in a second dielectric layer stacked above the first dielectric layer;
    a first wiring formed in the first trench;
    a second wiring formed in the second trench;
    a third dielectric layer interposed between an upper opening of the first trench and a bottom surface of the second trench, and configured to insulate the first wiring and the second wiring from each other;
    an impedance adjustment layer formed between the first wiring and the second wiring, configured to adjust an impedance between the first wiring and the second wiring, and serving as an inductor; and an etching stop layer formed above the third dielectric layer,
    wherein the third dielectric layer is formed on the first wiring,
    the second wiring is formed on the etching stop layer, and
    the impedance adjustment layer is formed between the third dielectric layer and the etching stop layer, and is in contact with the etching stop layer.

6. The semiconductor device of claim 4, wherein the material of the impedance adjustment layer includes vanadium dioxide.

7. The semiconductor device of claim 5, wherein the material of the impedance adjustment layer includes vanadium dioxide.

* * * * *